United States Patent
Huang

[19]

[11] Patent Number: 6,096,595
[45] Date of Patent: Aug. 1, 2000

[54] INTEGRATION OF A SALICIDE PROCESS FOR MOS LOGIC DEVICES, AND A SELF-ALIGNED CONTACT PROCESS FOR MOS MEMORY DEVICES

[75] Inventor: Jenn Ming Huang, Hsin-Chu, Taiwan

[73] Assignee: Taiwan Semiconductor Manufacturing Company, Hsin-Chu, Taiwan

[21] Appl. No.: 09/310,254

[22] Filed: May 12, 1999

[51] Int. Cl.[7] .............................................. H01L 21/8234
[52] U.S. Cl. ..................... 438/238; 438/257; 438/210; 438/275
[58] Field of Search ............................................. 438/238

[56] References Cited

U.S. PATENT DOCUMENTS

| | | | |
|---|---|---|---|
| 5,668,359 | 9/1997 | Fang et al. | 438/239 |
| 5,731,239 | 3/1998 | Wong et al. | 439/296 |
| 5,792,684 | 8/1998 | Lee et al. | 438/238 |
| 5,817,562 | 10/1998 | Chang et al. | 438/305 |
| 5,998,251 | 12/1999 | Wu et al. | 438/241 |
| 6,008,081 | 12/1999 | Wu | 438/210 |
| 6,037,222 | 3/2000 | Huang et al. | 438/257 |

*Primary Examiner*—Wael Fahmy
*Assistant Examiner*—William M. Brewster
*Attorney, Agent, or Firm*—George O. Saile; Stephen B. Ackerman

[57] ABSTRACT

A semiconductor fabrication process has been developed, allowing the integration of high performance MOS logic devices, and high density, MOS memory cell arrays, to be realized on the same semiconductor chip. The process features the use of two gate insulator layers, featuring different thicknesses, with the thinner of the two gate insulator layers, used for the high performance MOS logic devices. Two insulator spacers, featuring different thicknesses, are also employed, with the thinner spacer of the insulator spacers used on the sides of the polycide gate structures, to minimize memory cell area, while the thicker insulator spacers, on the sides of the polysilicon gate structures, in the MOS logic region, are used to allow a robust salicide procedure to be performed. In addition SAC openings, are used in the MOS memory region, for purposes of miniaturization, while salicide layers are used to improve the performance of MOS logic components.

23 Claims, 14 Drawing Sheets

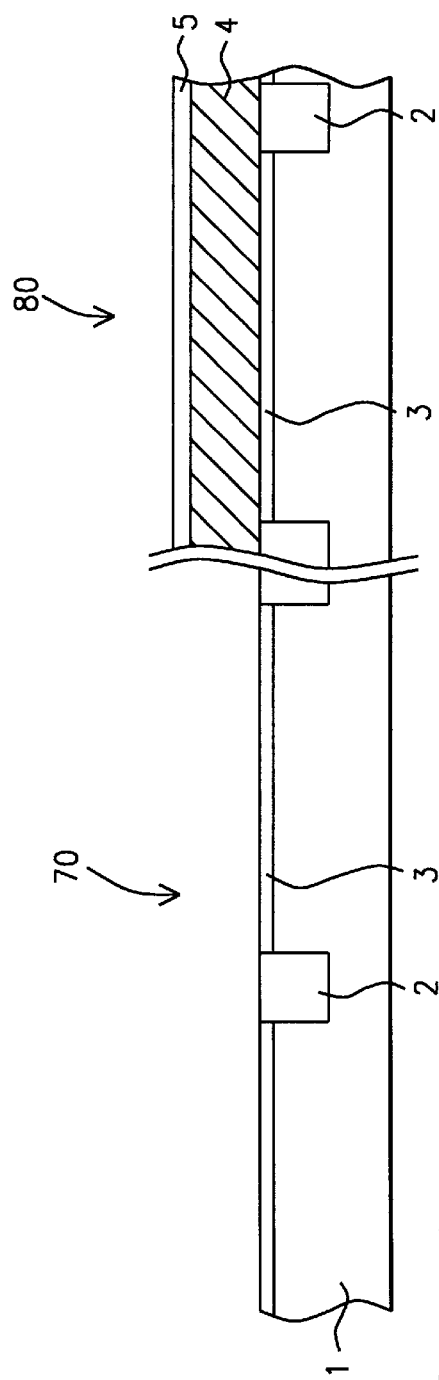
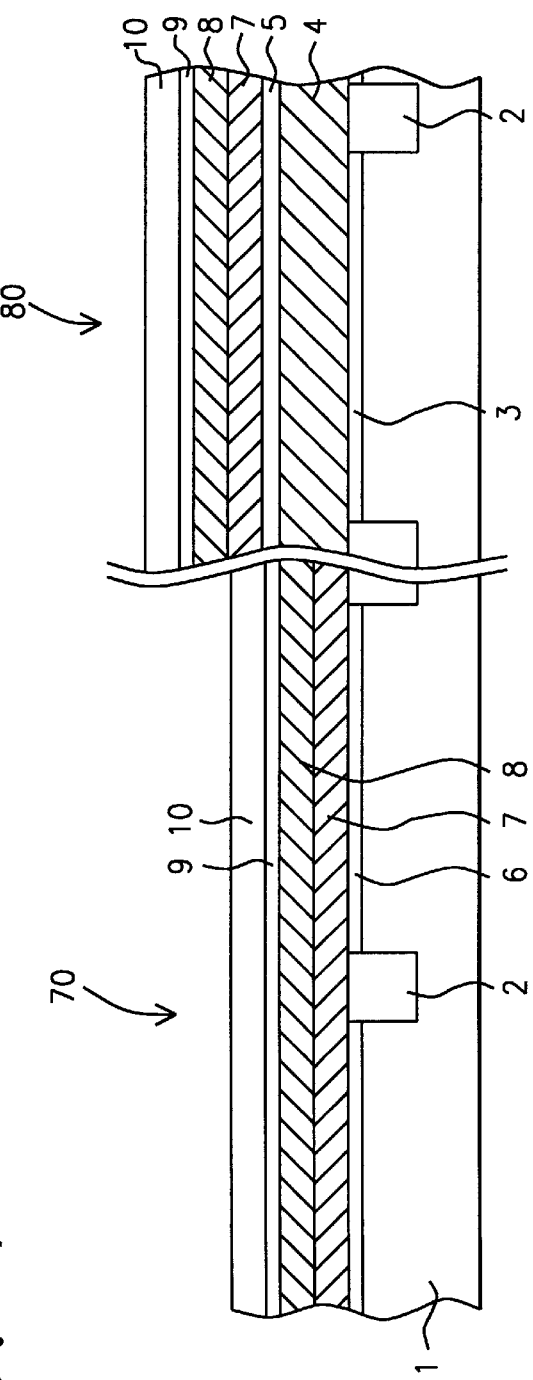

INTEGRATION OF A SALICIDE PROCESS FOR MOS LOGIC DEVICES, AND A SELF-ALIGNED CONTACT PROCESS FOR MOS MEMORY DEVICES

BACKGROUND OF THE INVENTION (1) Field of the Invention

This invention relates to processes used to fabricate semiconductor devices, and more specifically a process used to integrate logic devices, and memory devices, on a single semiconductor chip.

(2) Description of Prior Art

Advanced semiconductor chips, now being manufactured in industry, are composed of logic or memory devices. Logic devices are used to process information or data, while memory devices are used for data storage. These two types of devices can be found in almost all computers, however they are usually found on specific chips, reserved for either logic or memory applications. In systems in which logic and memory devices are packaged separately, data signals between the two may have to pass through several levels of packaging, which can result in undesirable propagation delays. In addition the manufacturing costs for fabricating wafers producing only logic chips, and wafers with only memory chips, are greater than if both logic and memory applications can be incorporated on the same chip. Therefore for performance and cost reasons the semiconductor industry has been motivated to produce a semiconductor chip with both the desired logic and memory requirements.

The efforts displayed by the semiconductor industry, in attempting to incorporate both logic and memory requirements on a single semiconductor chip have been increasing. One example of this type of invention has been offered by Lee et al, in U.S. Pat. No. 5,792,684. This prior art addresses the incorporation of metal oxide semiconductor field effect transistor, (MOSFET), memory devices, using a self-aligned contact, (SAC), structure for improving the density of memory cell arrays, and MOSFET logic devices, using a Self ALIgned siliCIDE, (Salicide), for improved device performance. However this present invention will offer unique processing sequences, not shown by Lee et al, such as process sequences that will allow the dimension of the MOS memory device to be further decreased, while still allowing the performance of the MOS logic devices to be increased. For example specific rapid thermal anneal procedures, used for activation of source/drain regions, of MOS logic devices, are performed at a stage of the fabrication sequence that will allow a lowering of the self-aligned contact, (SAC), contact resistance, (Rc), to be realized. Another example of unique processing sequences, used in the present invention, is the use of different width spacers, on the sides of the gate structures, for each specific function. For example a wider spacer, needed to allow the use of a robust metal silicide process, for enhanced performance for MOS logic device, is achieved without impacting the use of a thinner spacer, used for the MOS memory device, therefore not increasing the size of the memory cell. Additional unique processing sequences used in this present invention result in the desired, device feature, specific for the memory and logic devices, such as different gate insulator layers, different gate structures, and different lightly doped source/drain, (LDD), regions.

SUMMARY OF THE INVENTION

It is an object of this invention to provide a process that allows the fabrication of MOS memory and MOS logic devices, to be achieved on the same semiconductor chip, or integrated circuit.

It is another object of this invention to provide a fabrication process that allows the integration of MOS memory devices, fabricated with a SAC structure, allowing density enhancements to be realized, with MOS logic devices, fabricated using a salicide layers on gate structures, and on source/drain regions, allowing performance enhancements to be realized.

It is still another object of this invention to provide a fabrication process that allows the insulator spacers, formed on the sides of the gate structures of MOS logic devices, to be wider than the spacers formed on the gate structures of the MOS memory devices.

It is still yet another object of this invention to perform a rapid thermal anneal procedure, at a specific stage of the integrated fabrication process, to activate the ion implanted species in the source/drain regions, of the MOS logic devices, while reducing the contact resistance between the self-aligned contact structure and underlying regions.

In accordance with the present invention a fabrication process is described for integrating MOS memory devices and MOS logic devices on the same silicon chip. After formation of isolation regions, in a semiconductor substrate, a first gate insulator layer, and a polysilicon layer, are formed on a first region of the semiconductor substrate, to be used for the MOS logic devices. While protecting the first region of the semiconductor substrate, polycide gate structures, are formed on a second gate insulator layer, on a second region of the semiconductor substrate, to be used for the fabrication of MOS memory devices. After formation of lightly doped source/drain regions, and insulator spacers, on the sides of the polycide gate structures, a first interlevel planarization oxide, (IPO), layer is deposited and planarized, followed by the formation of self-aligned contact, (SAC), openings, in the first IPO layer, exposing the lightly doped source/drain regions, located between polycide gate structure, in the second region of the semiconductor substrate. After formation of lower polysilicon plug structures, located in the SAC openings, the first IPO layer is removed from the polysilicon layer, located in the first region of the semiconductor substrate. Formation of polysilicon gate structures, on the first gate insulator layer, in the first region of the semiconductor substrate, is followed by the formation of lightly doped source/drain regions, insulator spacers on the sides of the polysilicon gate structures, and formation of heavily doped source/drain regions. After forming a protective oxide layer, on the polysilicon plug structures, located in the second region, or the MOS memory region, of the semiconductor substrate, salicide, (Self-ALigned silICIDE), layers are formed on the top surface of the polysilicon gate structures, as well as on the heavily doped source/drain regions, located in the first region, or in the MOS logic region, of the semiconductor substrate. After deposition of a second IPO layer, openings are formed, in the second IPO layer, exposing the top surface of a first polysilicon plug structure, to be used as a component for a subsequent bit line structure, and exposing the top surface a second polysilicon plug structure, to be used as a component for a storage node structure. Polysilicon structures are next formed in the openings in the second IPO layer, with a first polysilicon structure, used as a bit line structure, contacting the underlying, first polysilicon plug structure, while a second polysilicon structure, overlying the second polysilicon plug structure, is used as a storage node contact structure. After deposition of a third IPO layer, a storage node opening is formed in the third IPO layer, exposing the top surface of the storage node contact structure. A polysilicon, storage node structure, with vertical, and horizontal features, is next formed in the storage node opening, followed by the formation of a capacitor dielectric layer, and an overlying polysilicon upper electrode structure, completing the formation of a stacked capacitor structure, in the second region, or the MOS memory region, of the semiconductor substrate. Contact hole openings are formed in the insulator layers, allowing metal structures to contact the salicided gate structures, and source/drain regions, for the MOS logic devices, while similar contact hole openings are formed in the second region of the semiconductor substrate, allowing metal structures to contact specific elements of the MOS memory devices.

BRIEF DESCRIPTION OF THE DRAWINGS

The object and other advantages of this invention are best described in the preferred embodiment with reference to the attached drawings that include:

FIGS. 1–15, which schematically, in cross-sectional style, illustrates the stages of fabrication used to simultaneously create MOS memory devices, using a self-aligned contact structure, as well as MOS logic devices, featuring a salicide layer, on a semiconductor substrate.

DESCRIPTION OF THE PREFERRED EMBODIMENTS

Figure 3:
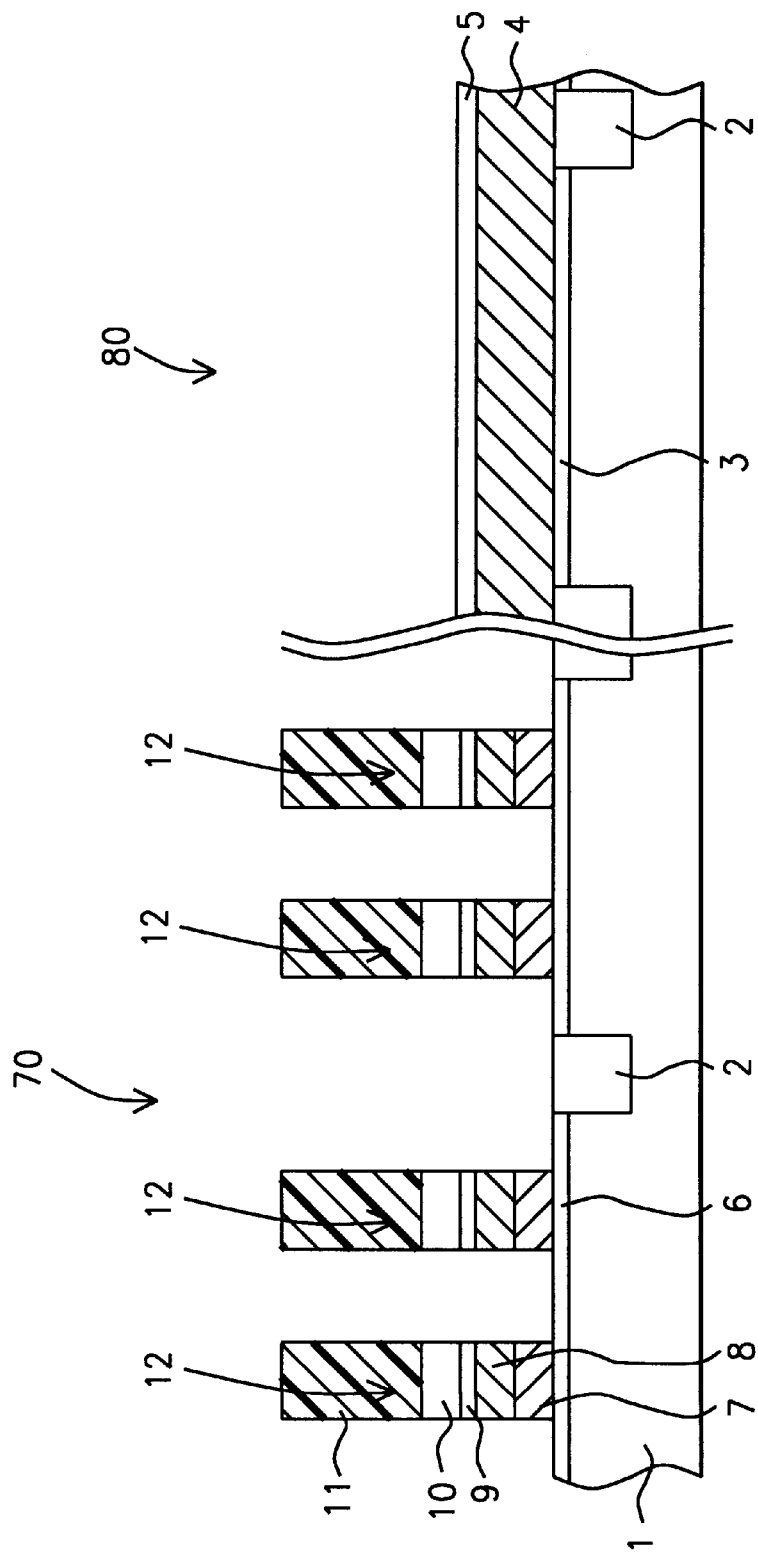

The fabrication process used to simultaneously create both MOS memory devices, and MOS logic devices, on a single semiconductor chip will now be covered in detail. FIG. 1, shows a region 70, to be used to accommodate the MOS memory devices, while the MOS logic devices will be fabricated in region 80. The MOS memory devices will be described as N type, MOSFET devices, however this invention can also be accomplished using P channel, or PFET devices, for the MOS memory devices, accomplished by creating N wells in specific areas of the P type, semiconductor substrate, and using P type ion implantation dopants for P type source and drain regions. The MOS logic devices will also be described as NFET devices, in this invention, however PFET devices, can also be fabricated, in the logic region, in addition to the NFET devices, resulting in complimentary, (CMOS), devices. This again would be accomplished by forming an N well area, in the area of region 80, to be used for the PFET devices, followed by the formation of P type, lightly doped, and heavily doped, source/drain regions.

A P type, single crystalline silicon substrate 1, having a <100> crystallographic orientation is used. Isolation regions 2, are next formed in semiconductor substrate 1. Isolation regions 2, are shallow trench isolation, (STI), regions, formed via creation of shallow trenches, to a depth between about 2500 to 5000 Angstroms, in semiconductor substrate 1, using conventional photolithographic and anisotropic, reactive ion etching, (RIE), procedures. After removal of the photoresist shape, used to define the shallow trenches, accomplished via plasma oxygen ashing and careful wet cleans, a silicon oxide is deposited using either low pressure chemical vapor deposition, (LPCVD), or plasma enhanced chemical vapor deposition, (PECVD), procedures, at a thickness between about 5000 to 14000 Angstroms, completely filling the shallow trenches. Planarization procedures are next employed to remove silicon oxide from all regions but the shallow trench, resulting in STI, isolation regions 2, schematically shown in FIG. 1. Planarization can be accomplished via chemical mechanical polishing, or via selective RIE processing, using $CHF_3$ as an etchant.

A gate insulator layer 3, comprised of silicon dioxide, is thermally grown in an oxygen-steam ambient, at a temperature between about 750 to 1000° C., to a thickness between about 20 to 100 Angstroms, on all regions of semiconductor substrate 1, not occupied by isolation regions 2. First polysilicon layer 4, is next deposited, undoped, via LPCVD procedures, to a thickness between about 1000 to 2500 Angstroms. First polysilicon layer 4, will be doped when comprised as a gate electrode, during the fabrication of the N type, and P type, heavily doped source/drain regions. Silicon oxide layer 5, can next deposited via LPCVD or plasma enhanced chemical vapor deposition, (PECVD), procedures, at a thickness between about 100 to 300 Angstroms, if desired. The option of using silicon oxide layer 5, will be to serve as an etch stop layer, in MOS logic region 80, during the subsequent formation of gate structures, in MOS memory region 70. However the attainment of this etch stop layer, can also be achieved during the subsequent growth of gate insulator 6. Conventional photolithographic procedures are next used to protect MOS logic region 80, from RIE procedures, used to remove, (silicon oxide layer 5, if used as an option), and to remove first polysilicon layer 4, exposed in the unprotected MOS memory region 70, using $CHF_3$ as an etchant for silicon oxide, (if silicon oxide layer 5, is used), and using $Cl_2$ as an etchant for first polysilicon layer 4. The result of these process steps is schematically shown in FIG. 1. The region of gate insulator layer 3, exposed in MOS memory region 70, is then removed, via use of a buffered hydrofluoric acid solution, prior to removal of the photoresist shape, that was used as the blockout mask, protecting MOS logic region 80. The photoresist shape is then removed using plasma oxygen ashing and careful wet cleans.

Gate insulator layer 6, comprised of silicon oxide, is next thermally grown, in an oxygen-steam ambient, on exposed regions of semiconductor substrate 1, in MOS memory region 70. Gate insulator layer 6, is grown to a thickness between about 50 to 100 Angstroms, thicker than gate insulator 3, in MOS logic region 80. The thicker, gate insulator layer 6, will offer improved yield and reliability, used in the dense memory cell arrays, while thinner gate insulator layer 3, will allow enhanced performance of MOS logic devices to be realized. A series of layers, to be used as components of subsequent MOS memory, gate structures, are next deposited, and schematically shown in FIG. 2. A second polysilicon layer 7, is deposited using LPCVD procedures, at a thickness between about 500 to 1500 Angstroms. Second polysilicon layer 7, is either doped in situ, during deposition, via the addition of arsine, or phosphine, to a silane ambient, or second polysilicon layer 7, can be deposited intrinsically, then doped via ion implantation of arsenic, or phosphorous ions. Tungsten silicide layer 8, is next deposited, via LPCVD procedures, at a thickness between about 500 to 1500 Angstroms, followed by the LPCVD or PECVD depositions, of silicon oxide layer 9, at a thickness between about 50 to 300 Angstroms, and silicon nitride layer 10, at a thickness between about 1000 to 2500 Angstroms. The use of silicon oxide layer 9, is optional.

Photoresist shapes 11, are next used as masks, to allow the definition of silicon nitride capped, polycide, (tungsten silicide-polysilicon), gate structures 12, to be realized, on gate insulator 6, in MOS memory region 70. This is shown schematically in FIG. 3, and accomplished via anisotropic RIE procedures, using $CF_4$ as an etchant for silicon nitride layer 10, using $CHF_3$ as an etchant for silicon oxide layer 9, while $Cl_2$ is used as the selective etchant for tungsten silicide layer 8, and for second polysilicon layer 7. The selectivity of the $Cl_2$ etchant, allows the RIE procedure to terminate on gate insulator layer 6, in MOS memory region 70, while silicon oxide layer 5, (or the silicon oxide layer that was formed on polysilicon layer 4, during the growth of gate insulator 6), behaved as the etch stop, in MOS logic region 80. The procedure used to form polycide gate structures 12, in MOS memory region 80, was also used to remove the regions of silicon nitride layer 10, the regions of silicon oxide layer 9, the regions of tungsten silicide layer 8, and the regions of second polysilicon layer 7, exposed in MOS logic region 80. Photoresist shapes 12, are removed via plasma oxygen ashing and careful wet cleans.

Figure 4:
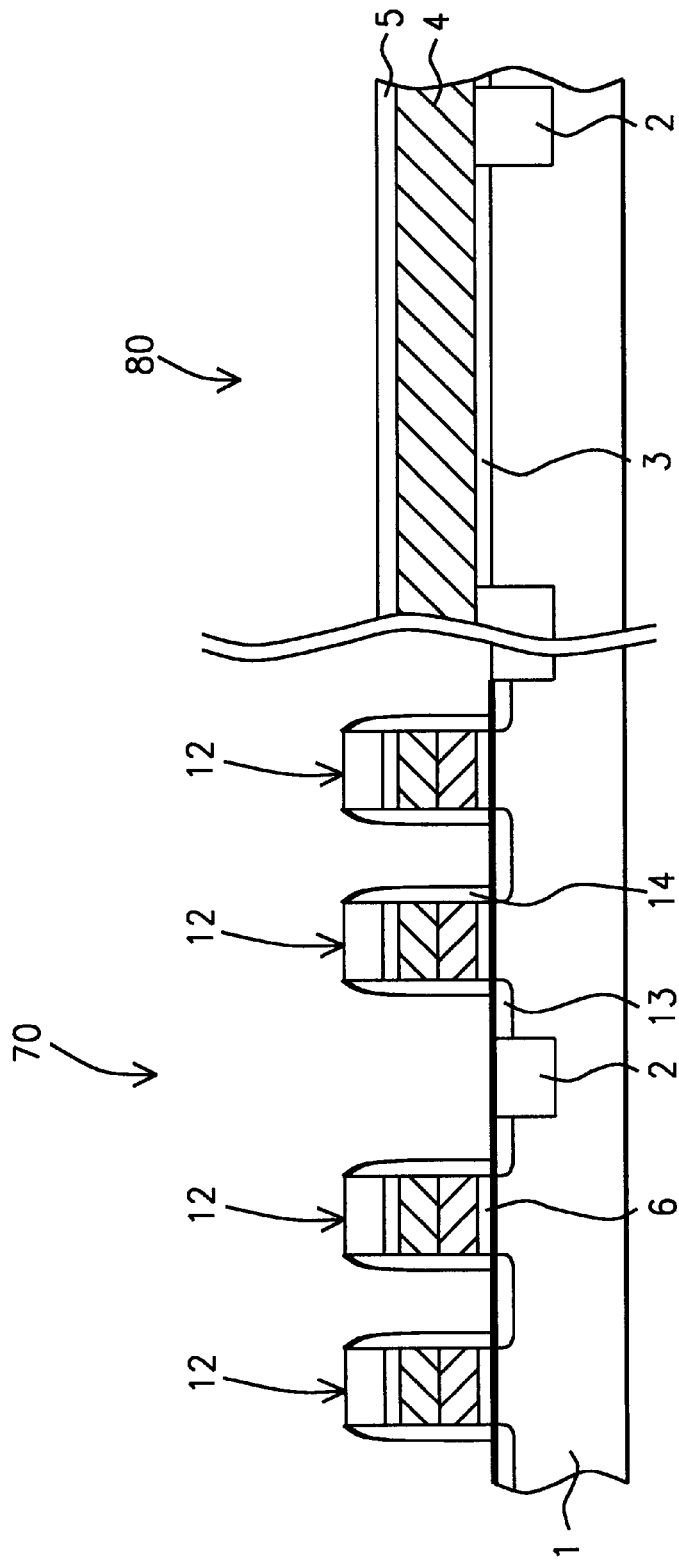

Lightly doped source/drain regions 13, are next formed in areas of semiconductor substrate 1, not covered by polycide gate structures 12, via ion implantation of arsenic, or phosphorous ions, at an energy between about 20 to 50 KeV, at a dose between about 1E13 to 1E14 atoms/$cm^2$, is used to produce a lightly doped source and drain. A silicon nitride layer is next deposited, using LPCVD or PECVD procedures, at a thickness between about 500 to 1000 Angstroms, followed by an anisotropic RIE procedure, using $CF_4$ as an etchant, to create first insulator spacers 14, on the sides of polycide gate structures 12. This is schematically shown in FIG. 4. If desired a silicon oxynitride, spacer can be employed. The thickness of first insulator spacer 14, will be thinner than a subsequent insulator spacer, to be used in the MOS logic region. The thinner spacer will satisfy the density requirements of a MOS memory cell array, while the thicker insulator spacer, to be subsequently formed in the MOS logic region, will allow salicide process to be more comfortably established. Regions of gate insulator layer 6, not covered by polycide gate structures 12, are removed during the spacer definition procedure.

Figure 5:
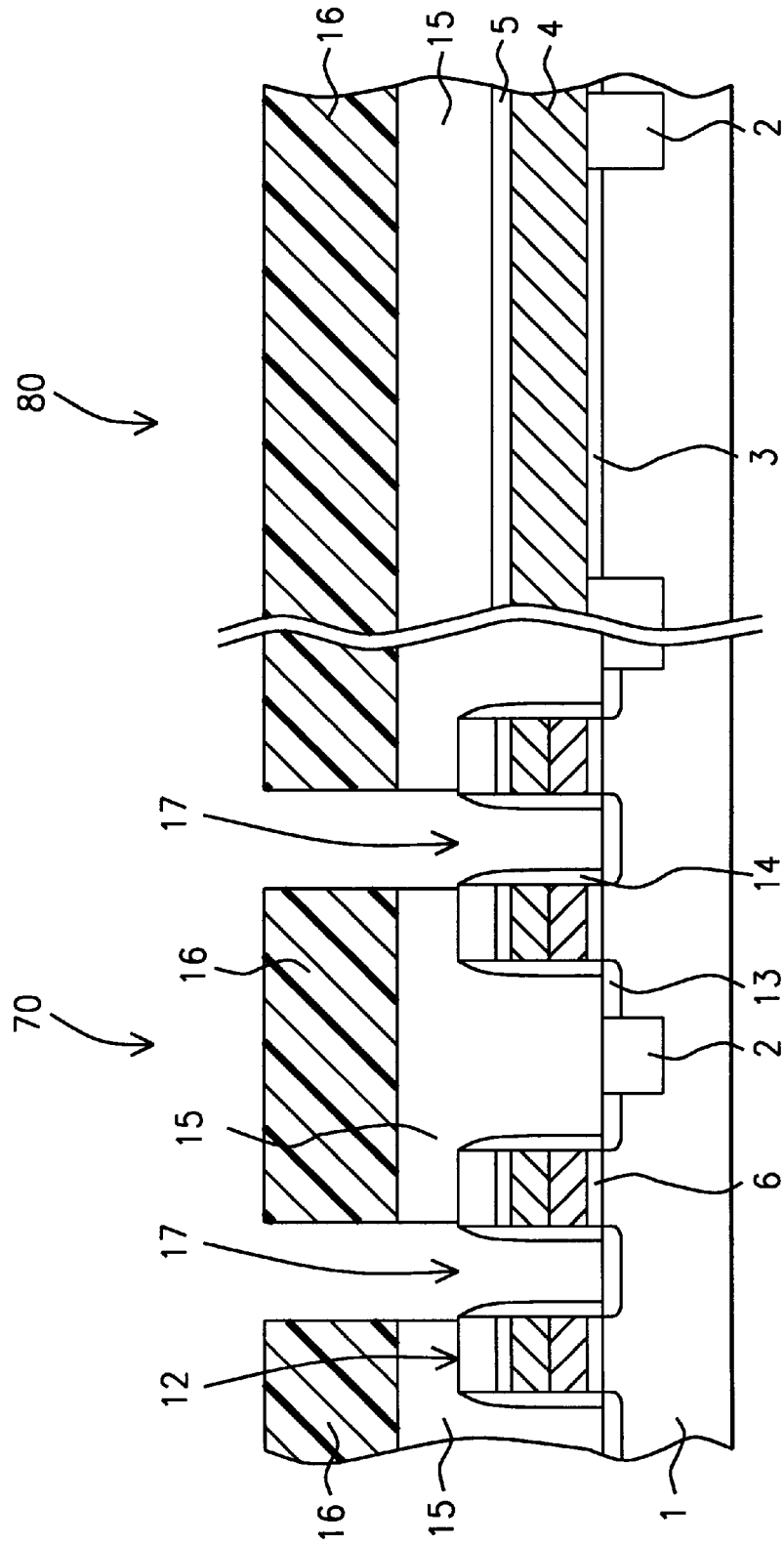

A first, interlevel planarization oxide, (IPO), layer 15, comprised of either silicon oxide, or a borophosphosilicate glass, (BPSG), layer, schematically shown in FIG. 5, is deposited, via PECVD procedures, to a thickness between about 4000 to 8000 Angstroms,. Planarization of first IPO layer 15, is accomplished via chemical mechanical polishing, (CMP), resulting in a smooth top surface topography. Photoresist shape 16, is then used as a mask to allow SAC openings 17, to be created in first IPO layer 15, exposing lightly doped source/drain regions 13, located between polycide gate structures 12, in MOS memory region 70. SAC openings 17, with a diameter larger than the space between polycide gate structures 12, exposes a space between the polycide gate structures that is smaller than the minimum space obtainable via conventional photolithographic procedures, thus contributing to the MOS memory, density requirements. SAC openings 17, are formed via a selective RIE procedure, using $CHF_3$ as an etchant, allowing first IPO layer 15, to be removed, while silicon nitride spacer 14, and silicon nitride layer 10, protect polycide gate structures 12. The selectivity, or etch rate ratio, of silicon oxide, to silicon nitride, in the selective $CHF_3$ etchant, is about 10 to 1.

Figure 6:
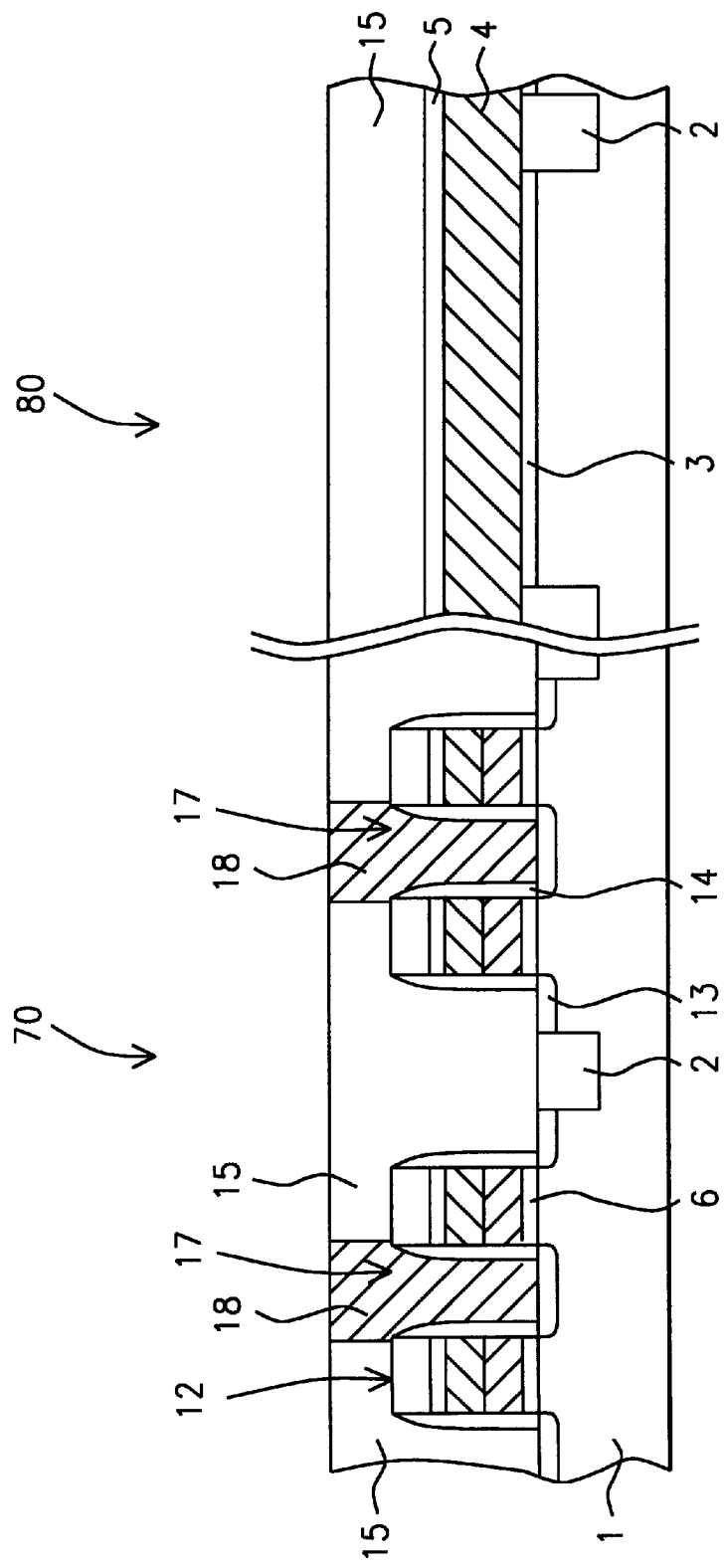
Figure 7:
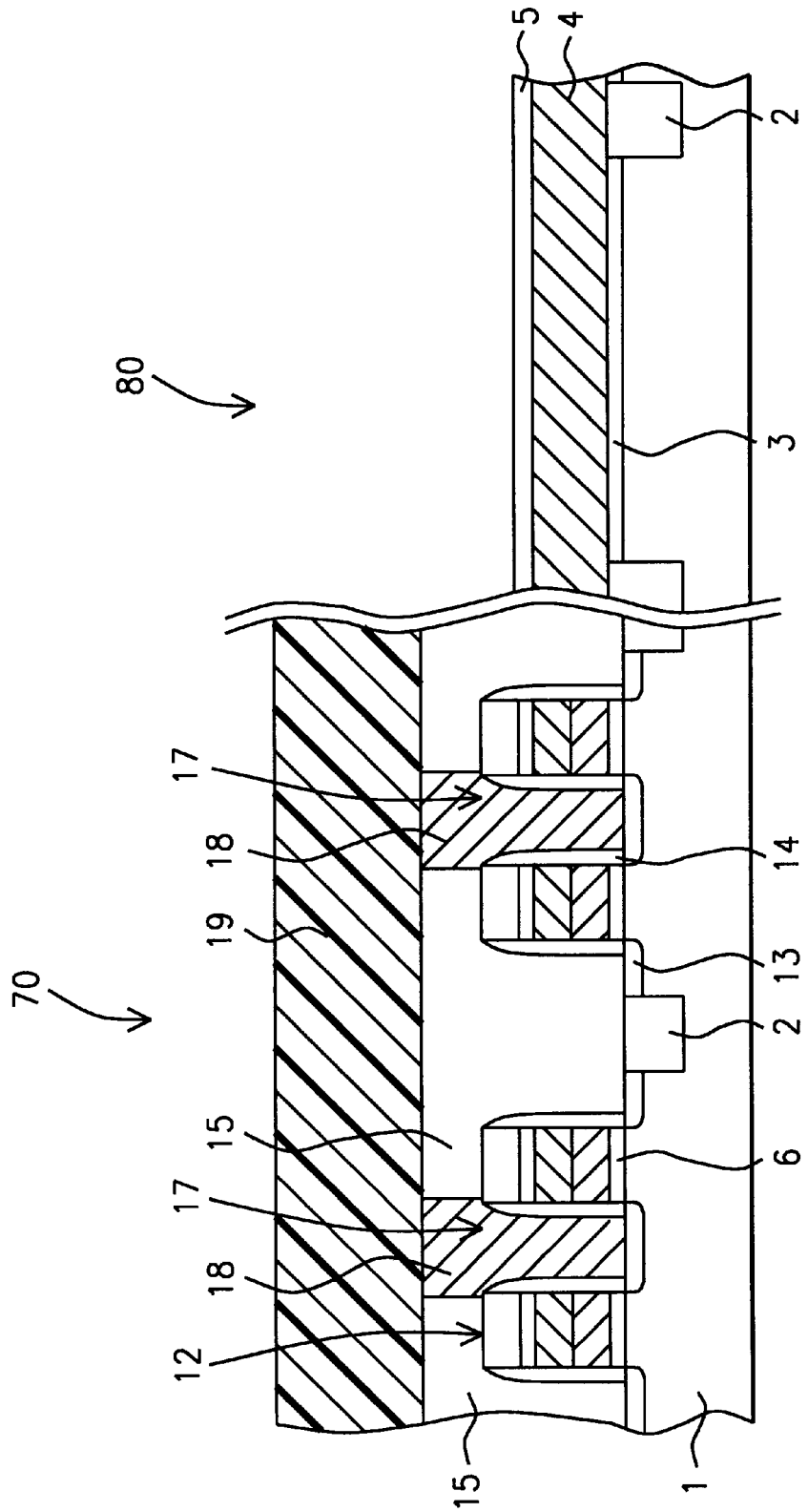

After removal of photoresist shape 16, via plasma oxygen ashing and careful wet cleans, a polysilicon layer is deposited using LPCVD procedures, to a thickness between about 2000 to 5000 Angstroms, completely filling SAC openings 17. The polysilicon layer is in situ doped, during deposition, via the addition of arsine, or phosphine, to a silane ambient. Removal of unwanted regions of the polysilicon layer, from the top surface of first IPO layer 15, is accomplished via a CMP procedure, or via a selective RIE procedure, using $Cl_2$ as an etchant, forming SAC structures, or lower polysilicon plug structures 18, in SAC openings 17. This is schematically shown in FIG. 6. A photoresist blockout shape 19, is then employed to allow the exposed region of first IPO layer 15, and the exposed region of silicon oxide layer 5, to be removed in MOS logic region 80. The selective removal of these insulator layers is accomplished using either a buffered hydrofluoric acid solution, or via a selective RIE procedure, using $CHF_3$ as an etchant, stopping on underlying first polysilicon layer 4. This is schematically shown in FIG. 7.

Figure 8:
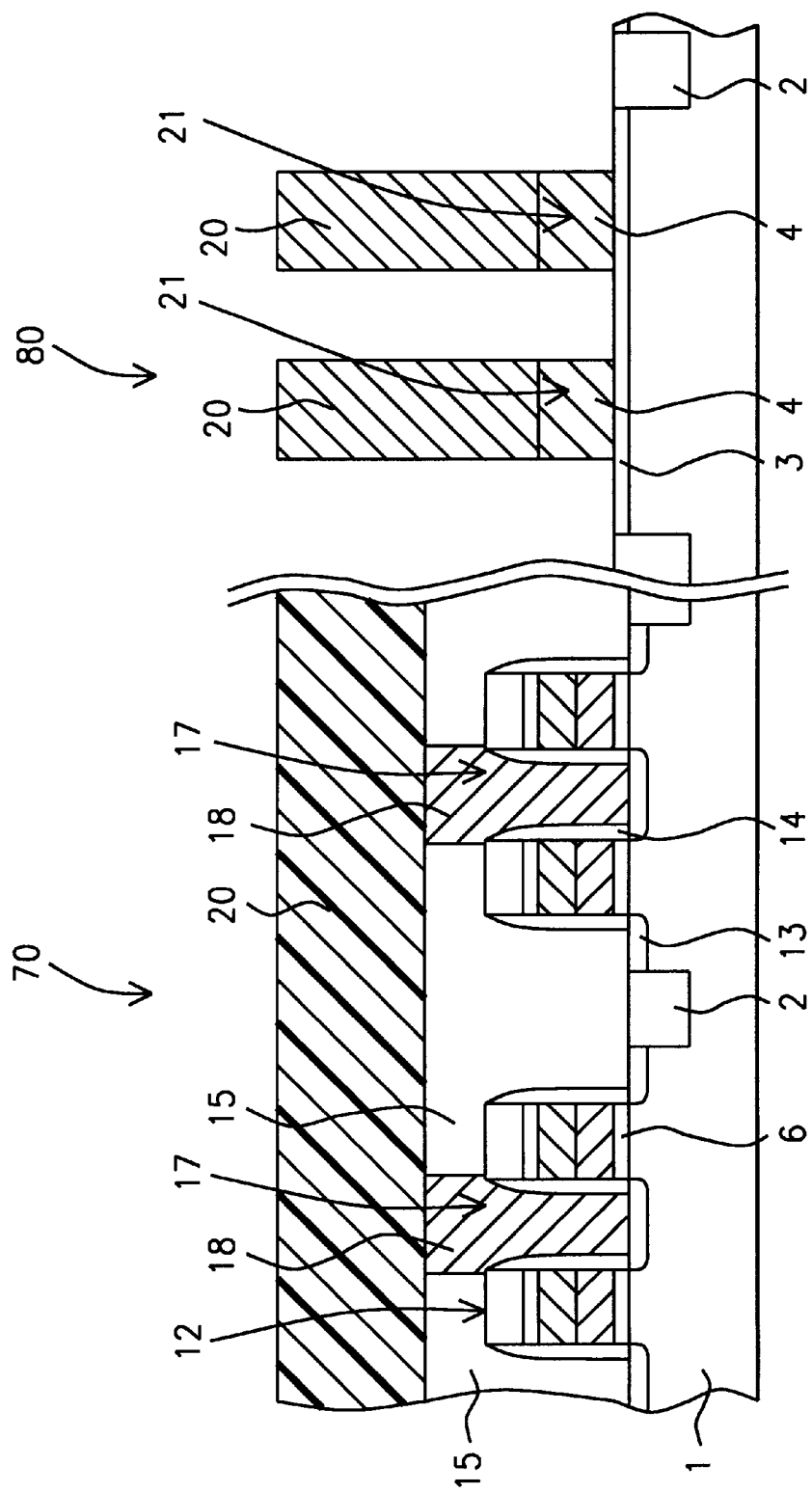

Photoresist shape 20, is next used as a mask to allow definition of polysilicon gate structures 21, to be formed on first gate insulator layer 3, in MOS logic region 80. This is accomplished via an anisotropic, and selective RIE procedure, using $Cl_2$ as an etchant for first polysilicon layer 4, with the RIE procedure slowing, and endpointing, at the appearance of gate insulator layer 3. The result of this procedure is schematically shown in FIG. 8.

Lightly doped source/drain regions 22, are next formed in areas of MOS logic region 80, not covered by polysilicon gate structures 21, via ion implantation of arsenic, or phosphorous ions, at an energy between about 20 to 50 KeV, at a dose between about 1E13 to 1E14 atoms/$cm^2$. Although not shown in the drawings, another area of MOS logic region 80, is used to fabricate PFET devices, and thus additional masking, and additional ion implantation procedures, using boron, or $BF_2$, are used to create the lightly doped source/drain region, for the MOS logic, PFET devices. Insulator spacers 23, on the sides of polysilicon gate structures 21, shown schematically in FIG. 9, comprised of either silicon oxide, silicon nitride, or silicon oxynitride, are formed via initially depositing the insulator layer via LPCVD or PECVD procedures, at a thickness between about 1000 to 2000 Angstroms. A following anisotropic RIE procedure, using $CHF_3$ as an etchant if a silicon oxide layer is used for the insulator spacer, or using $CF_4$ as an etchant, if a silicon nitride or silicon oxynitride layer is used, is then employed to define insulator spacers 23. Insulator spacers 23, are intentionally designed to be thicker than insulator spacers 14, used in MOS memory region 70. The thicker insulator spacer will allow a robust salicide process to be used in MOS logic region 80, with decreased risk of gate to substrate shorts, as a result of the thicker insulator spacers.

Figure 9:
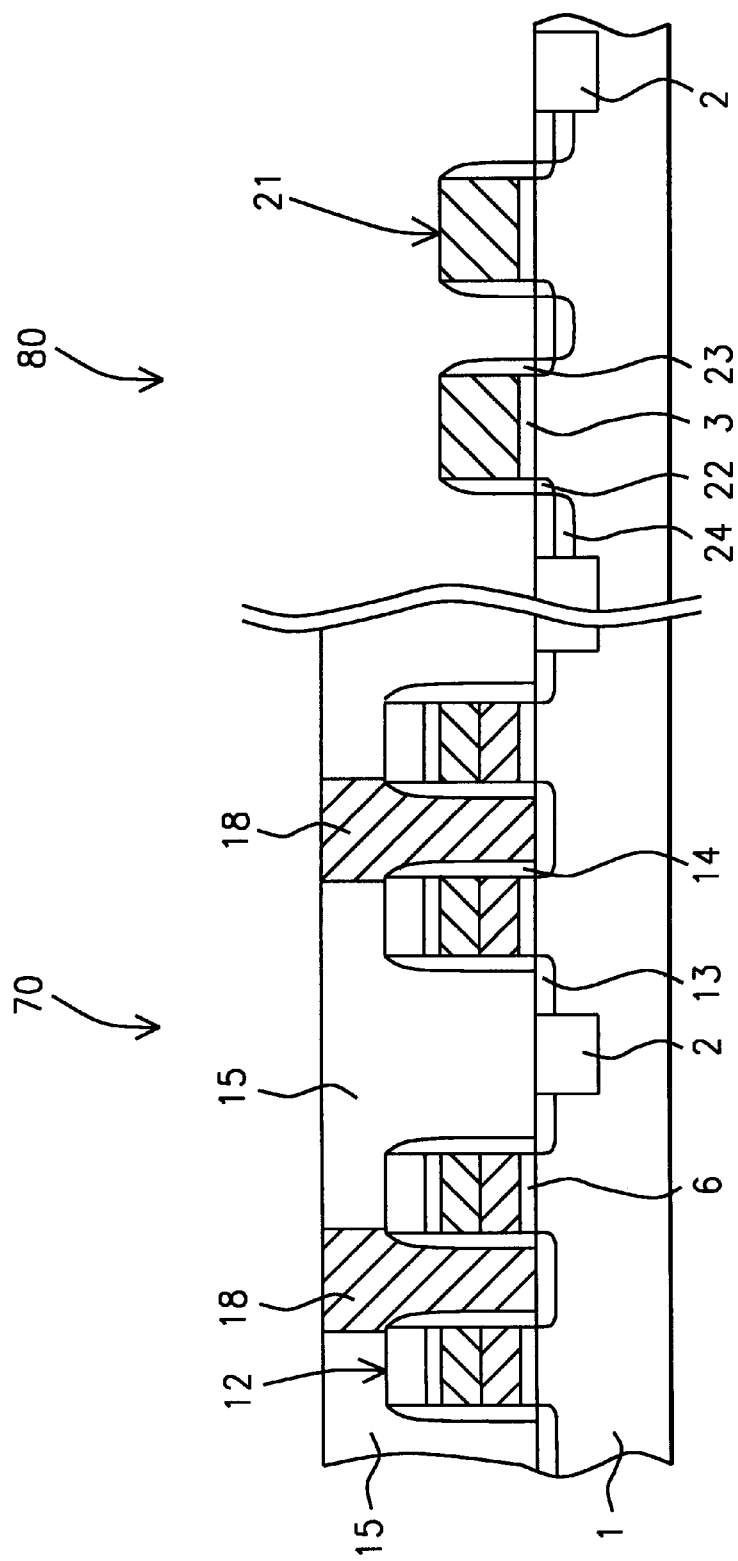

Heavily doped source/drain region 24, is formed in the areas of MOS logic region 80, not covered by polysilicon gate structures 21, or by insulator spacers 23. This is schematically shown in FIG. 9. Heavily doped source/drain region 24, is formed via an ion implantation procedure, using arsenic or phosphorous ions, at an energy between about 30 to 80 KeV, at a dose between about 1E15 to 1E16 atoms/$cm^2$. This ion implantation procedure also results in the doping of exposed polysilicon gate structures 21. A rapid thermal anneal, (RTA), procedure, performed at a temperature between about 900 to 1100° C., for a time between about 5 to 30 sec., is next used to activate the source/drain dopants, and also results in a reduction of the contact resistance, (Rc), of the lower polysilicon plug structures 18, to underlying lightly doped source/drain regions 13, in MOS memory region 70. In addition, photoresist masking is used to allow heavily doped, P type, source/drain regions, to be formed in an area of MOS logic region, via an ion implantation procedure using $BF_2$ or boron ions. The PFET devices are not shown in the drawings. An RTA procedure, is again used to activate the P type, source/drain dopants.

Figure 10:
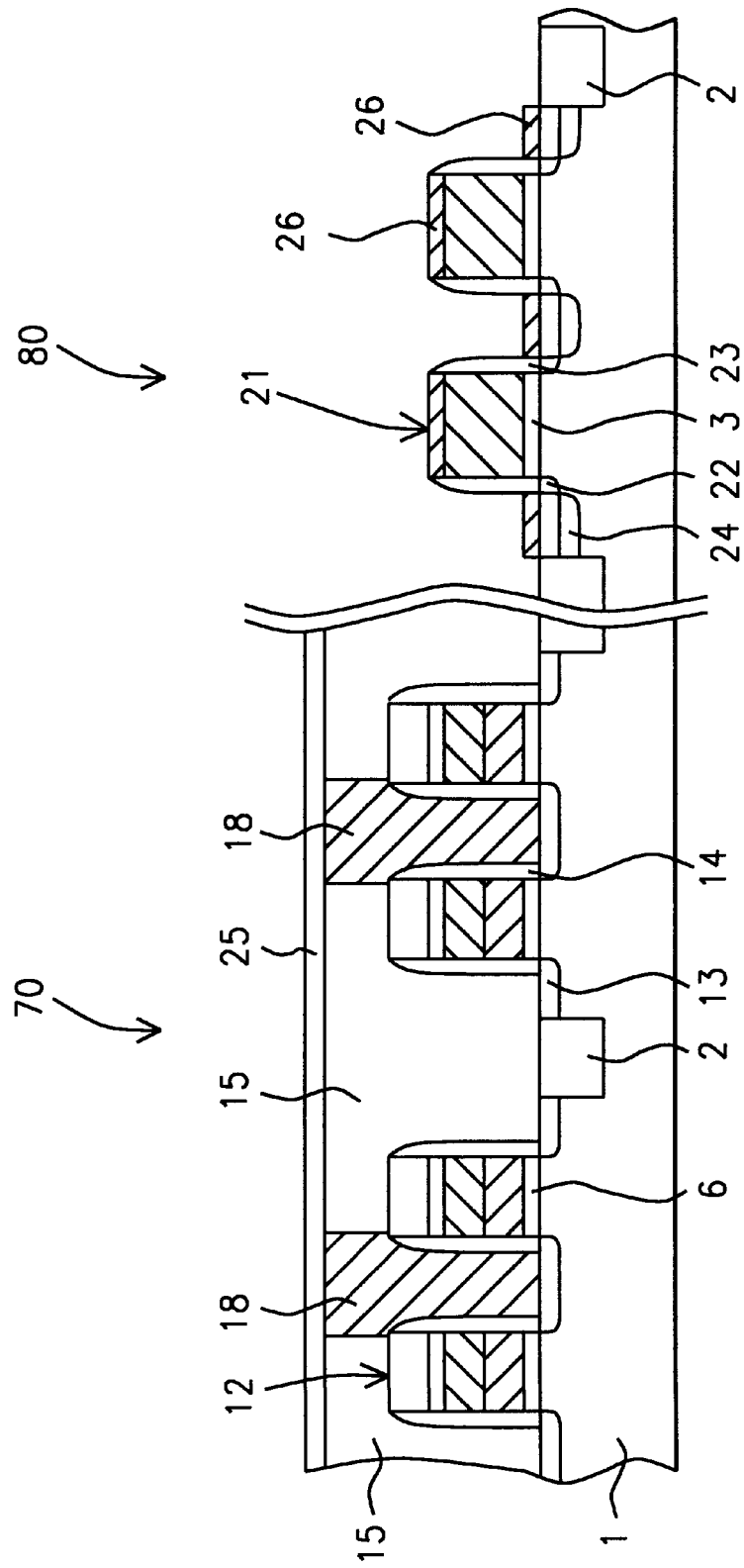

A resist protect oxide, (RPO), layer 25, comprised of silicon oxide, is next deposited, via LPCVD or PECVD procedures, at a thickness between about 200 to 400 Angstroms. A photoresist blockout mask, not shown in the drawings, is used to remove RPO layer 25, from MOS logic region 89, via a selective RIE procedure, using $CHF_3$ as an etchant, or via use of a buffered hydrofluoric acid solution. A layer of titanium, or cobalt, is next deposited, at a thickness between about 100 to 500 Angstroms, via R.F. sputtering procedures. A first RTA procedure is then performed at a temperature between about 700 to 850° C., in a nitrogen ambient, to selectively form titanium silicide, or cobalt silicide layers 26, at a thickness between about 300 to 1000 Angstroms, on the top surface of heavily doped source/drain region 24, and on the top surface of polysilicon gate structures 21, in MOS logic region 80. Unreacted regions of titanium, or cobalt, residing on RPO layer 25, in MOS memory region 70, or residing on insulator spacers 23, in MOS logic region 80, are selectively removed using a solution of 1:1:5 of $NH_4OH$—$H_2O_2$—$H_2O$, at a temperature between about 30 to 70° C. This Self-ALIgned siliCIDE, (SALICIDE), procedure allows the metal silicide layer to be reside only in areas of the MOS logic region 80, where enhanced performance is desired. The result of these the salicide formation is schematically shown in FIG. 10. A second RTA anneal, performed at a temperature between about 800 to 900° C., can be used, if desired, to form a different phase of metal silicide, resulting in a decrease resistivity of the metal silicide layers.

Figure 11:
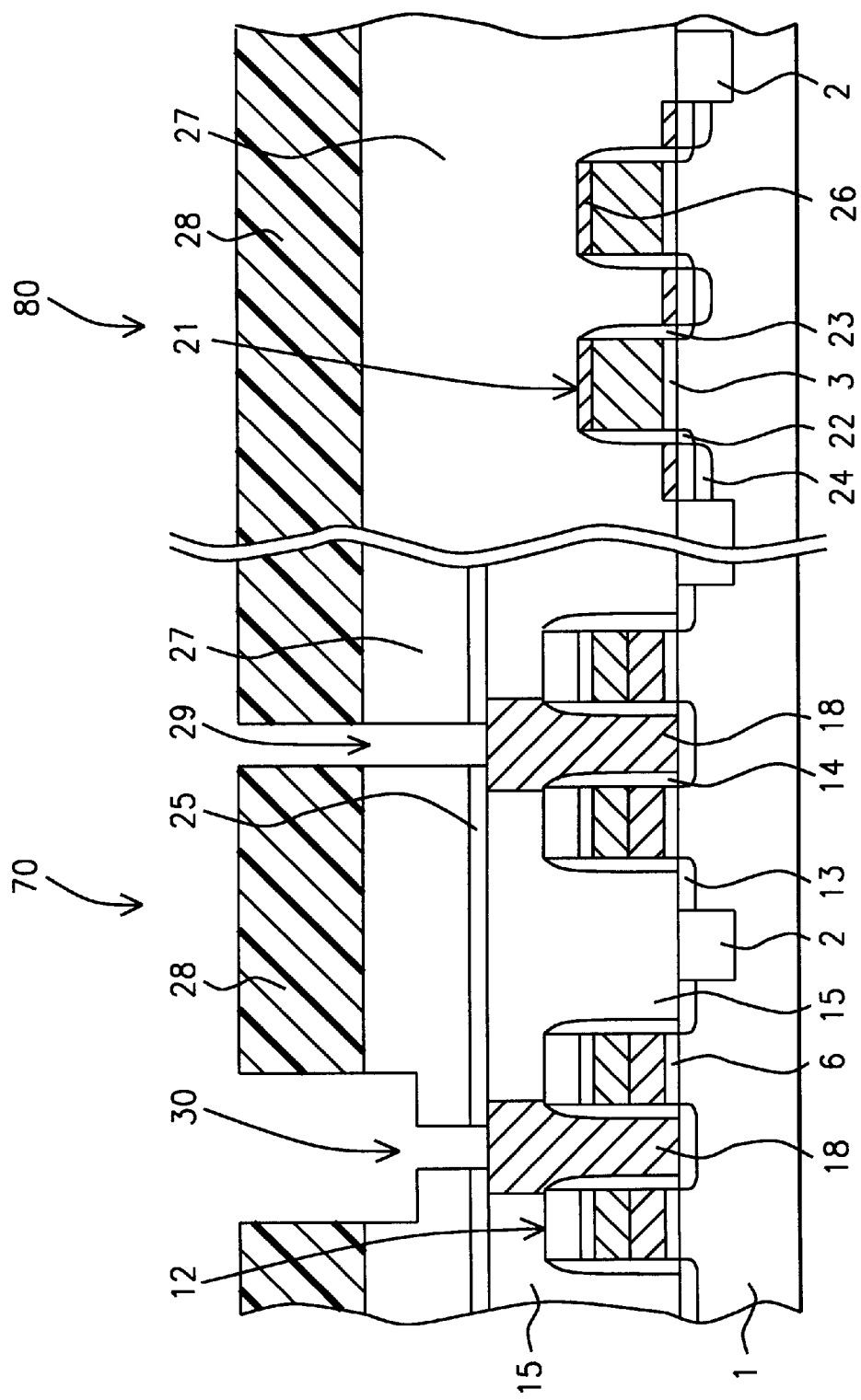

A second IPO layer 27, comprised of silicon oxide, or BPSG, is next deposited, via PECVD procedures, to a thickness between about 4000 to 8000 Angstroms. A chemical mechanical polishing procedure is used to planarize second IPO layer 27, resulting in a smooth, and level, top surface topography. Without the use of the planarization step, second IPO layer 27, in MOS memory region 70, would be at a higher level than second IPO layer 27, located in MOS logic region 80. This is schematically shown in FIG. 11. Photoresist shape 28, is then used as a etch mask, to allow storage node opening 29, and a wide component, of dual damascene, bit line opening 30, to be formed in second IPO layer 27, and in RPO layer 25, via an anisotropic RIE procedure, using $CHF_3$ as an etchant. A narrow component, of the dual damascene, bit line opening 30, was formed prior to the formation of the wide component of the dual damascene, bit line opening, to depth between about 1000 to 3000 Angstroms, in second IPO layer 27, via conventional photolithography and an anisotropic RIE procedure. This is also schematically shown in FIG. 11.

Figure 12:
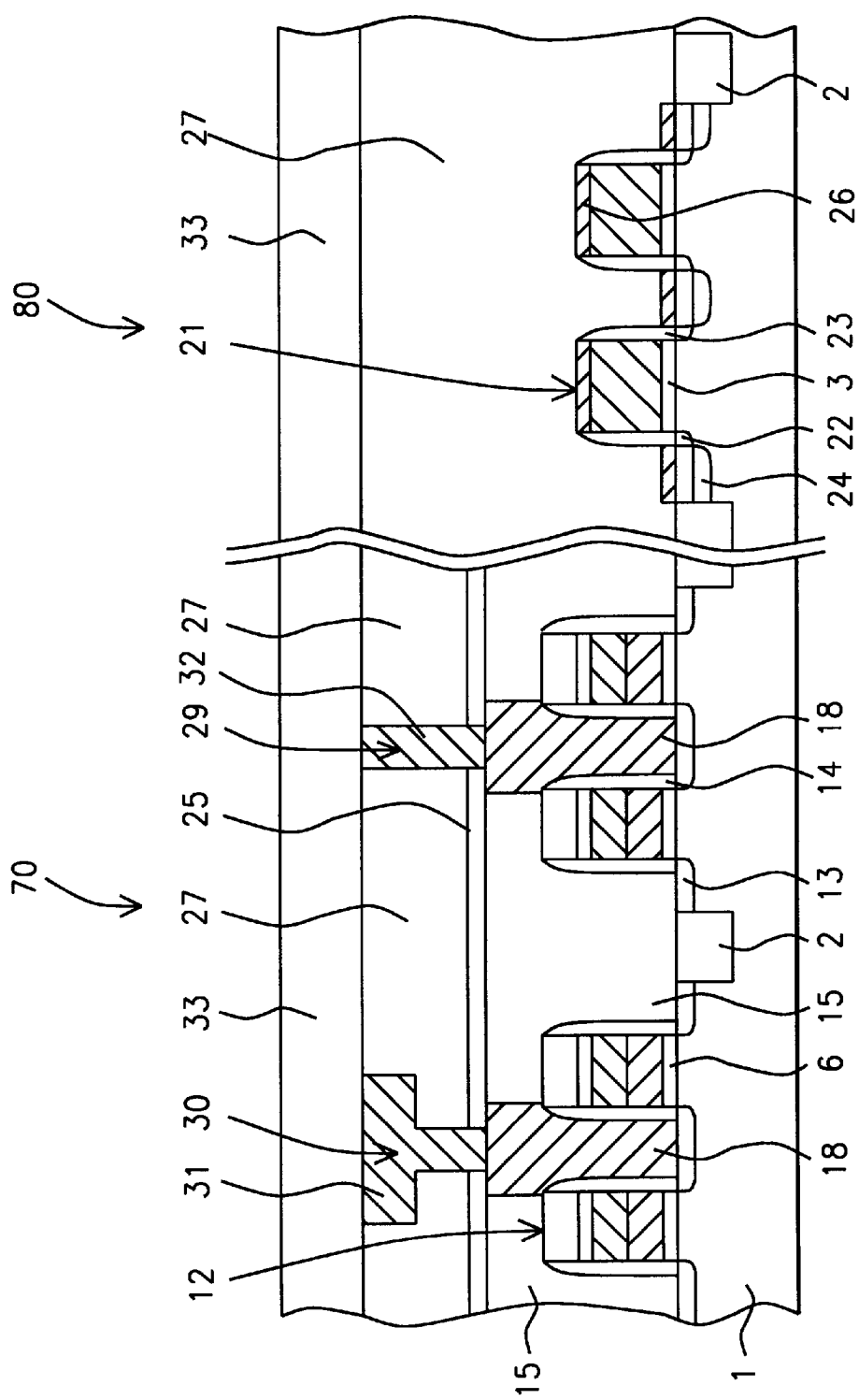

After removal of photoresist shape 28, via plasma oxygen ashing and careful wet cleans, a polysilicon layer is deposited, using LPCVD procedures, at a thickness between about 2000 to 3000 Angstroms. The polysilicon layer is in situ doped during deposition, via the addition of arsine, or phosphine, to a silane ambient, completely filling both dual damascene, bit line opening 30, and storage node opening 29. Removal of unwanted regions of the polysilicon layer, from the top surface of second IPO layer 27, using either a CMP procedure, or a selective RIE procedure, using $Cl_2$ as an etchant, result in the formation of dual damascene, bit line structure 31, in dual damascene, bit line opening 30, and storage node contact structure 32, in storage node opening 29. This is schematically shown in FIG. 12. A third IPO layer 33, again comprised of either silicon oxide, or BPSG, is next deposited, via LPCVD or PECVD procedures, at a thickness between about 7000 to 12000 Angstroms.

Figure 13:
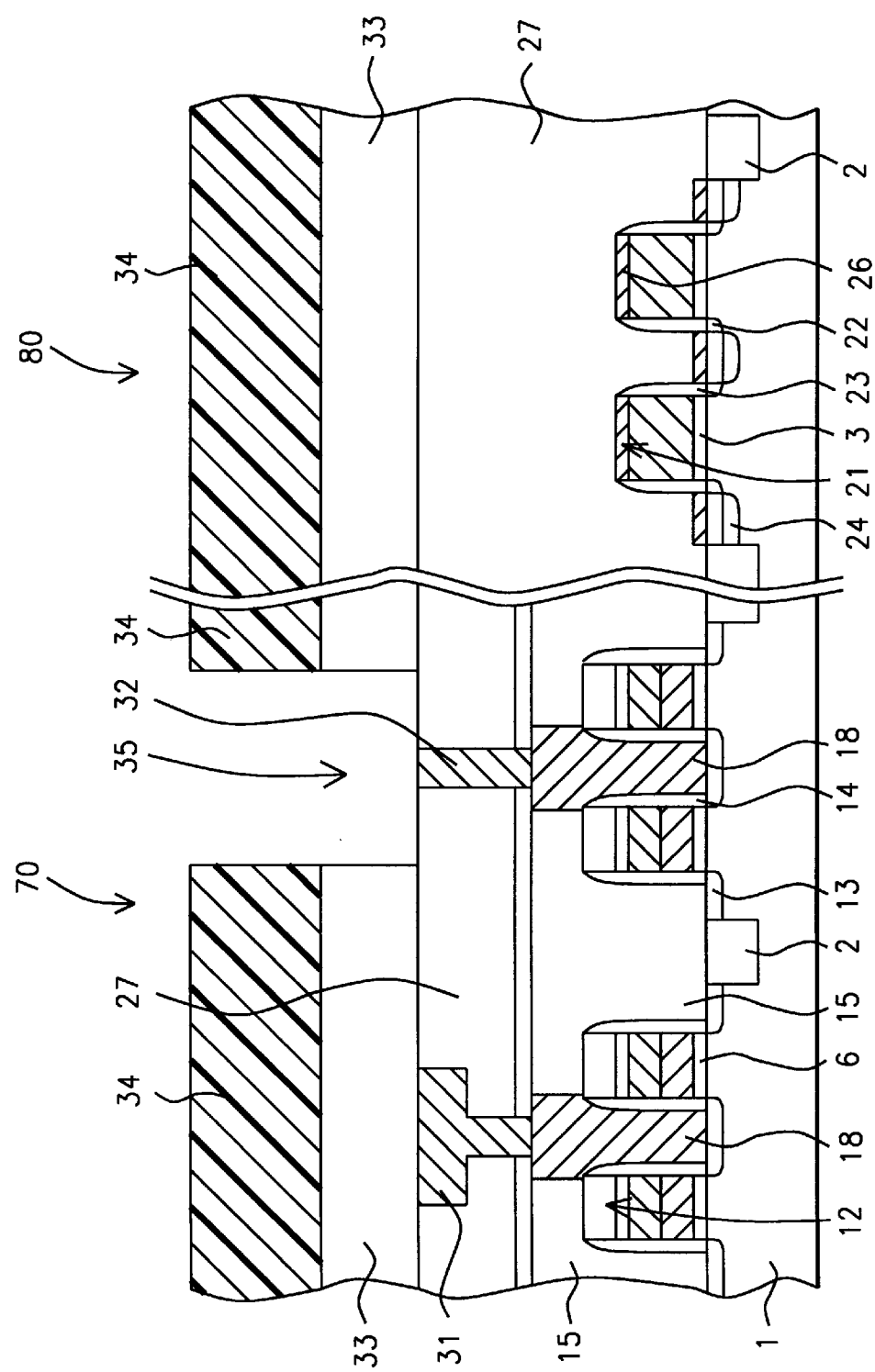

Photoresist shape 34, is used as a mask to allow capacitor opening 35, to be formed in third IPO layer 33, via an anisotropic RIE procedure, using $CHF_3$ as an etchant. Capacitor opening 35, shown schematically in FIG. 13, exposes the top surface of storage node contact structure 32.

Figure 14:
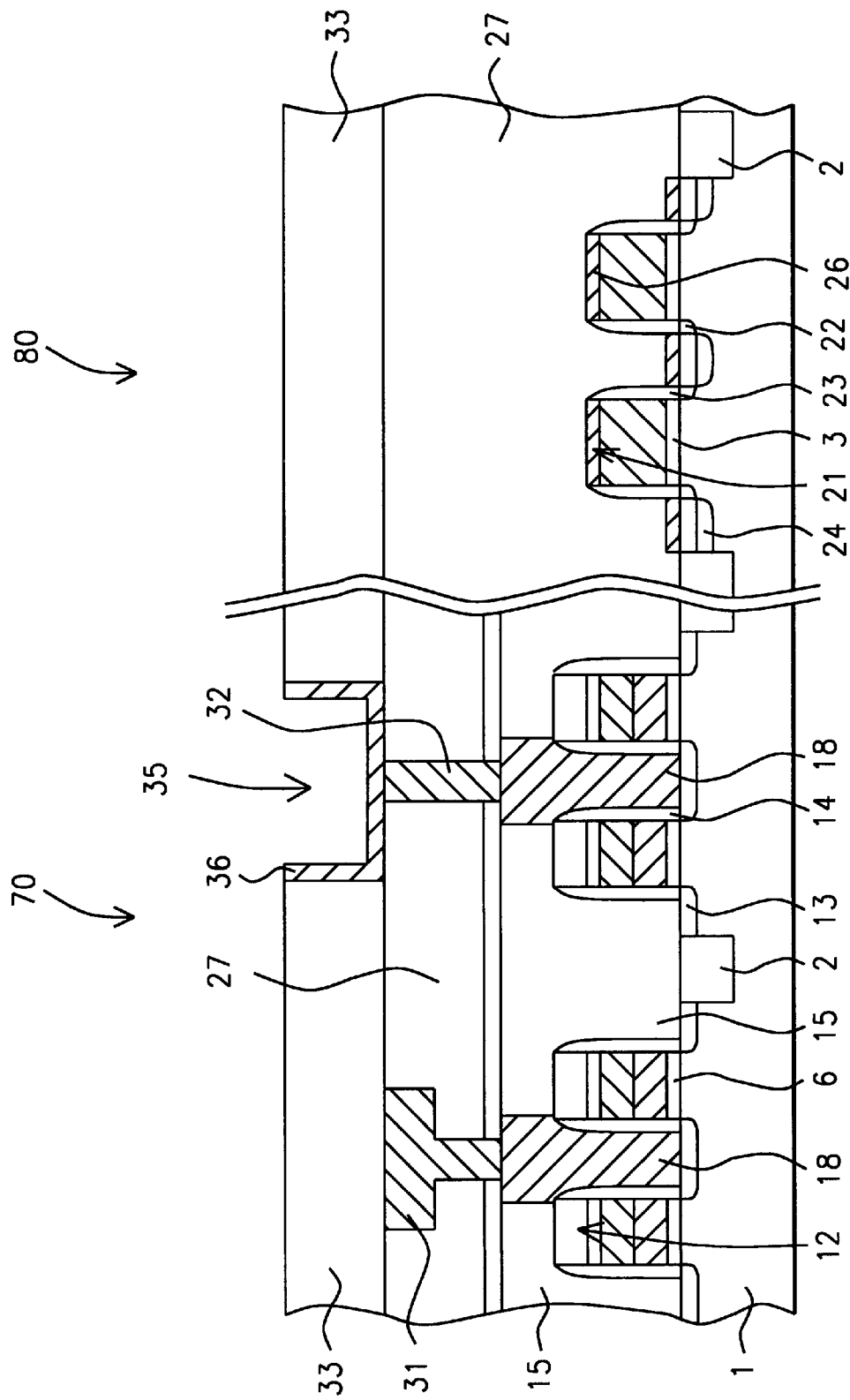

After removal of photoresist shape 34, via plasma oxygen ashing and careful wet cleans, a polysilicon layer is deposited, via LPCVD procedures, at a thickness between about 500 to 1000 Angstroms. The thin polysilicon layer, in situ doped during deposition, via the addition of arsine, or phosphine, to a silane ambient, lines the surface of capacitor opening 35, as well as residing on the top surface of third IPO layer 33. A CMP procedure is then employed to remove the regions of the thin polysilicon layer which resided on the top surface of third IPO layer 33, resulting in polysilicon storage node structure 36, schematically shown in FIG. 14. Polysilicon storage node structure 36, is comprised of vertical polysilicon features, located on the sides of capacitor opening 35, connected by a horizontal polysilicon feature, located at the bottom of capacitor opening 35, and contacting the top surface of storage node contact structure 32. This is schematically shown in FIG. 14. If desired, to further increase the surface area of storage node structure 36, a roughened, or a hemispherical grained silicon layer, can be deposited on the exposed surfaces of storage node structure 36.

Figure 15:
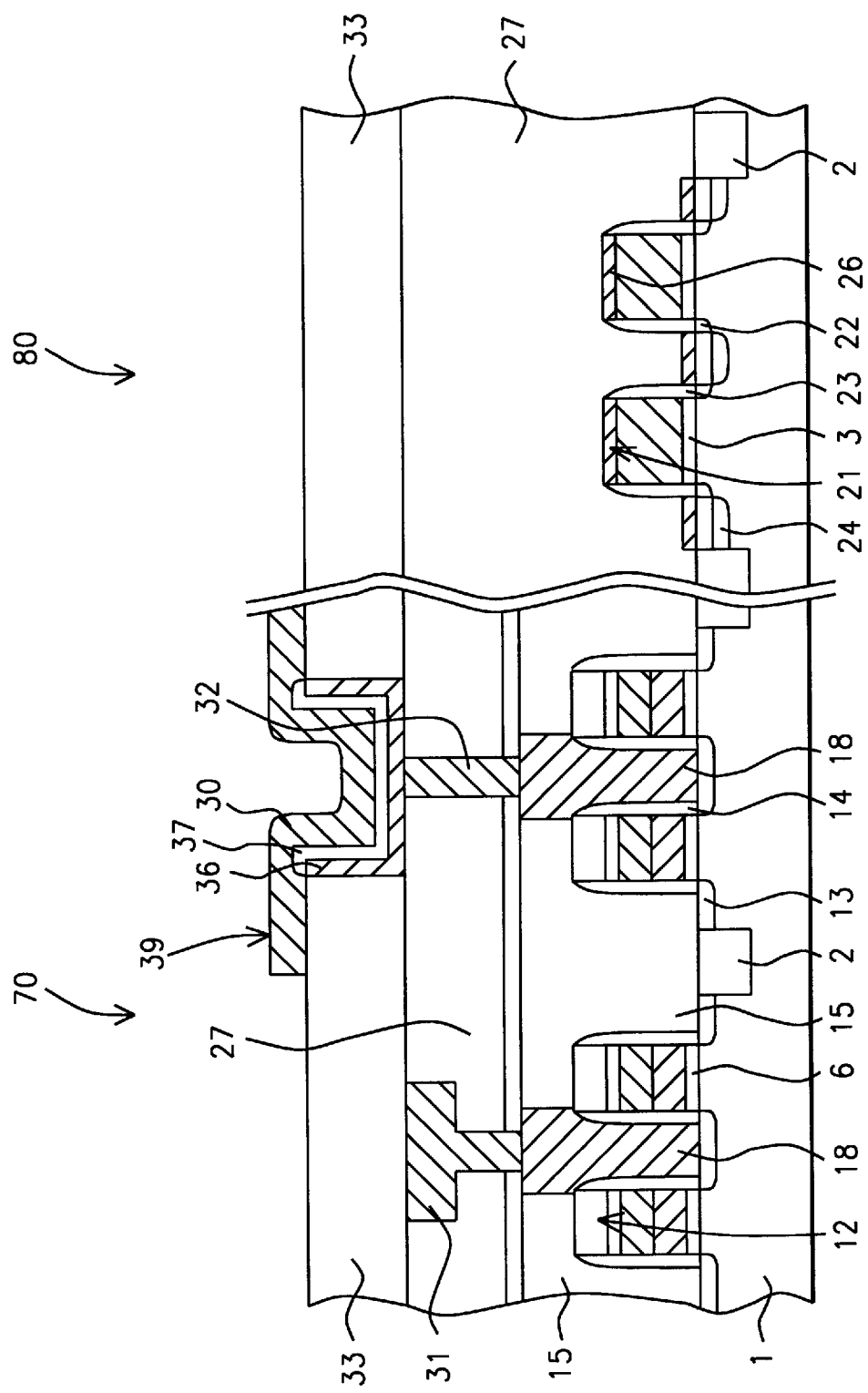

A capacitor dielectric layer 37, comprised of tantalum oxide, or comprised of ONO, (Oxidized Nitride on Oxide), is formed on the surface of storage node structure 36, at an equivalent silicon oxide thickness between about 35 to 50 Angstroms. A polysilicon layer is next deposited via LPCVD procedures, to a thickness between about 500 to 1000 Angstroms, with the polysilicon layer doped in situ, during deposition, via the addition of arsine, or phosphine, to a silane ambient. Conventional photolithographic and RIE procedures, using $Cl_2$ as an etchant, are employed to define polysilicon upper electrode structure 38, completing the fabrication of stacked capacitor structure 39, schematically shown in FIG. 15. The photoresist shape, used for definition of polysilicon upper electrode structure 38, is removed via plasma oxygen ashing and careful wet cleans.

Contact hole openings to elements in MOS memory region 70, as well as elements in MOS logic region 80, not shown in the drawings are made, via conventional photolithographic and RIE procedures. After deposition of a metal layer, such as aluminum or tungsten, conventional photolithographic and RIE procedures, are used to form metal structures, located in the contact hole openings, contacting the elements located in the MOS memory region, and located in the MOS logic region.

While this invention has been particularly shown and described with reference to, the preferred embodiments thereof, it will be understood by those skilled in the art that various changes in form and details may be made without departing from the spirit and scope of this invention.

What is claimed is:

1. A method of fabricating MOS memory devices, and MOS logic devices on a single semiconductor substrate, comprising the steps of:

forming silicon nitride capped, polycide gate structures, on a first gate insulator layer, on a first region of said semiconductor substrate, to be used for said MOS memory devices;

forming first lightly doped source/drain regions, in an area of said first region of said semiconductor substrate, not covered by said silicon nitride capped, polycide gate structures;

forming first insulator spacers on the sides of said silicon nitride capped, polycide gate structures;

depositing a first interlevel planarization, (IPO), layer;

forming self-aligned contact, (SAC), openings, in said first IPO layer, located in said first region of said semiconductor substrate, exposing said first lightly doped source/drain regions, located between said silicon nitride capped, polycide gate structures;

forming a first polysilicon plug structure, in a first SAC opening, and forming a second polysilicon plug structure, in a second SAC opening;

removing said first IPO layer, from said second region of said semiconductor substrate;

forming polysilicon gate structures, on a second gate insulator layer, on a second region of said semiconductor substrate, to be used for said MOS logic devices;

forming second lightly doped source/drain regions, in an area of said second region of said semiconductor substrate, not covered by said polysilicon gate structures;

forming second insulator spacers on the sides of said polysilicon gate structures;

forming heavily doped source/drain regions, in an area of said second region of said semiconductor substrate, not covered by said polysilicon gate structures, and not covered by said second insulator spacers;

performing a rapid thermal anneal procedure;

forming a protective insulator layer, in said first region of said semiconductor substrate, overlying the top surface of the polysilicon plug structures;

selectively forming a metal silicide layer on the top surface of said polysilicon gate structures, and on the top surface of said heavily doped source/drain regions;

depositing a second IPO layer;

forming a bit line opening, in said second IPO layer, and in said protective insulator layer, exposing a portion of the top surface of said first polysilicon plug structure, and forming a storage node opening in said second IPO layer, and in said protective insulator layer, exposing a portion of the top surface of said second polysilicon plug structure;

forming a bit line structure in said bit line opening, and forming a storage node contact structure, in said storage node opening;

depositing a third IPO layer;

forming a capacitor opening, in said third IPO layer, exposing the top surface of said storage node contact structure; and forming a capacitor structure in said capacitor opening.

2. The method of claim 1, wherein said first gate insulator, in said first region of said semiconductor substrate, is a silicon dioxide layer, thermally grown in an oxygen-steam ambient, to a thickness between about 50 to 100 Angstroms.

3. The method of claim 1, wherein the polycide component, of said silicon nitride capped, polycide gate structures, is: comprised of an underlying polysilicon layer, obtained via LPCVD procedures, to a thickness between about 500 to 1500 Angstroms, and either doped in situ, during deposition via the addition of arsine, or phosphine, to a silane ambient, or deposited intrinsically, then doped via ion implantation of arsenic or phosphorous ions; and comprised of an overlying tungsten silicide layer, obtained via LPCVD procedures, at a thickness between about 500 to 1500 Angstroms.

4. The method of claim 1, wherein said first lightly doped source/drain regions, located in said first region of said semiconductor substrate, are formed via ion implantation of phosphorous, or arsenic ions, at an energy between about 20 to 50 KeV, at a dose between about 1E13 to 1E14 atoms/$cm^2$.

5. The method of claim 1, wherein said first insulator spacers, on the sides of said silicon nitride capped, polycide gate structures, are formed from a silicon nitride layer, obtained via LPCVD or PECVD procedures, at a thickness between about 500 to 1000 Angstroms, followed by an anisotropic RIE procedure, using $CF_4$ as an etchant.

6. The method of claim 1, wherein said first IPO layer is either a silicon oxide layer, or a borophosphosilicate glass, (BPSG), layer, obtained via PECVD procedures, at a thickness between about 4000 to 8000 Angstroms.

7. The method of claim 1, wherein said SAC openings, are formed in said first IPO layer, via a selective RIE procedure, using $CHF_3$ as an etchant, with the selectivity, or etch rate ratio, of silicon oxide, to silicon nitride, of about 10 to 1.

8. The method of claim 1, wherein said first polysilicon plug structure, and said second polysilicon plug structure, are formed from a polysilicon layer, obtained via LPCVD procedures, at a thickness between about 2000 to 5000 Angstroms, in situ doped, during deposition, via the addition of arsine, or phosphine.

9. The method of claim 1, wherein said second gate insulator layer, located in said second region of said semiconductor substrate, is a silicon dioxide layer, at a thickness between about 20 to 100 Angstroms, obtained via thermal oxidation procedures, in an oxygen-steam ambient.

10. The method of claim 1, wherein said polysilicon gate structures, located in said second region of said semiconductor substrate, are formed from a polysilicon layer, obtained via LPCVD procedures, at a thickness between about 1000 to 2500 Angstroms, and either doped in situ, during deposition, via the addition of arsine, or phosphine, to a silane ambient, or doped via an ion implantation procedure, using arsenic, or phosphorous ions.

11. The method of claim 1, wherein said second insulator spacers, are formed to a thickness between about 1000 to 2000 Angstroms, and comprised of an insulator layer chosen from a group that includes, silicon oxide, silicon nitride, or silicon oxynitride, all obtained via LPCVD or PECVD procedures.

12. The method of claim 1, wherein said heavily doped source/drain regions, located in said second region of said semiconductor substrate, are created via ion implantation of arsenic or phosphorous ions, at an energy between about 30 to 80 KeV, at a dose between about 1E15 to 1E16 atoms/$cm^2$.

13. The method of claim 1, wherein said rapid thermal anneal procedure, is performed at a temperature between about 900 to 1100° C., for a time between about 5 to 30 sec., in a nitrogen ambient.

14. The method of claim 1, wherein said protective insulator layer is a silicon oxide layer, obtained via LPCVD or PECVD procedures, at a thickness between about 200 to 400 Angstroms.

15. The method of claim 1, wherein said metal silicide layer is a titanium silicide, or a cobalt silicide layer, selectively formed at a thickness between about 300 to 1000 Angstroms, on the top surface of said polysilicon gate structure, and on the top surface of said heavily doped source/drain regions.

16. A method of fabricating MOS memory, and MOS logic devices, on a single semiconductor substrate, with said MOS memory devices, featuring polycide gate structures, with first insulator sidewall spacers, on a second gate insulator layer, and with self-aligned contact openings, and with said MOS logic devices featuring, metal silicide-polysilicon gate structures, with second insulator sidewall spacers, on a first gate insulator layer, comprising the steps of:

forming isolation regions in said semiconductor substrate;

growing said first gate insulator layer on a region of semiconductor substrate to be used for said MOS logic devices;

forming a first polysilicon layer, on said first gate insulator layer, in the MOS logic region;

forming a first silicon oxide layer on said first polysilicon layer, in said MOS logic region;

growing a second gate insulator layer, thicker than said first gate insulator layer, on the region of said semiconductor substrate to be used for said MOS memory devices;

depositing a second polysilicon layer;

depositing a tungsten silicide layer;

depositing a thin silicon oxide layer;

depositing a capping silicon nitride layer;

performing an anisotropic RIE procedure to create silicon nitride capped, polycide gate structures, on said second gate insulator layer, in said MOS memory region, with said polycide gate structures, comprised of said tungsten silicide layer, on said second polysilicon layer, with said anisotropic RIE procedure completely removing said capping silicon nitride layer, said thin silicon oxide layer, said tungsten silicide layer, and said second polysilicon layer, from said first silicon oxide layer, in said MOS logic region;

forming first lightly doped source/drain regions, in a area of said MOS memory region, not covered by said silicon nitride capped, polycide gate structures;

forming said first insulator sidewall spacers, comprised of silicon nitride, on the sides of said silicon nitride capped, polycide gate structures;

depositing a first IPO layer;

forming said SAC openings, in said first IPO layer, between said silicon nitride capped, polycide gate structures located in said MOS memory region, with said SAC openings comprised with a width greater than the space between said silicon nitride capped, polycide gate structures, exposing said first lightly doped source/drain regions;

forming polysilicon plug structures, in said SAC openings;

removing the portion of said first IPO layer residing in said MOS logic region, and removing said first silicon oxide layer from said first polysilicon layer;

forming polysilicon gate structures, on said first gate insulator layer, in said MOS logic region;

forming second lightly doped source/drain regions, in said MOS logic region, in an area of said semiconductor substrate, not covered by said polysilicon gate structures;

forming said second insulator sidewall spacers on the sides of said polysilicon gate structures, with said second insulator sidewall spacers, thicker than said first insulator sidewall spacers, located on the sides of said silicon nitride capped, polycide gate structures, in said MOS memory region;

forming heavily doped source/drain regions, in said MOS logic region, in an area of said semiconductor substrate not covered by said polysilicon gate structures, and not covered by said second insulator sidewall spacers;

performing an RTA procedure;

forming a protective silicon oxide layer on said first IPO layer, and on the top surface of said polysilicon plug structures, in said MOS memory regions;

forming a metal silicide layer on the top surface of said polysilicon gate structures, and on the top surface of said heavily doped source/drain regions, in said MOS logic region;

depositing a second IPO layer;

forming a bit line opening in said second IPO layer, and in said protective silicon oxide layer, exposing the top surface of a first polysilicon plug structure, and opening a storage node contact hole, in said second IPO layer, and in said protective silicon oxide layer, exposing the top surface of a second polysilicon plug structure;

depositing a third polysilicon layer, completely filling said bit line opening, and completely filling said storage node contact hole;

removing regions of said third polysilicon layer from the top surface of said second IPO layer, creating a polysilicon bit line structure, in said bit line opening, and creating a polysilicon storage node contact structure, in said storage node contact hole;

depositing a third IPO layer;

forming a capacitor opening in said third IPO layer, exposing the top surface of said polysilicon storage node contact structure;

forming a polysilicon storage node structure, in said capacitor opening;

forming a capacitor dielectric layer, on said polysilicon storage node structure; and forming a polysilicon upper electrode structure, on said capacitor dielectric layer.

17. The method of claim 16, wherein said first gate insulator layer, in said MOS logic region, is a silicon dioxide layer, obtained via thermal oxidation procedures, in an oxygen-steam ambient, at a thickness between about 20 to 100 Angstroms.

18. The method of claim 16, wherein said second gate insulator layer is a silicon dioxide layer, thermally grown in an oxygen-steam ambient, to a thickness between about 50 to 100 Angstroms.

19. The method of claim 16, wherein said first insulator sidewall spacers, located on the sides of said silicon nitride capped, polycide gate structures, are comprised of silicon nitride, formed from a silicon nitride layer, deposited using LPCVD or PECVD procedures, at a thickness between about 500 to 1000 Angstroms, then subjected to an anisotropic RIE procedure, using $CF_4$ as an etchant.

20. The method of claim 16, wherein said second insulator sidewall spacers, located on the sides of said polysilicon gate structures, are comprised of either silicon nitride, silicon oxide, or silicon oxynitride, formed from a either a silicon nitride, silicon oxide, or silicon oxynitride layer, obtained via LPCVD or PECVD procedures, at a thickness between about 1000 to 2000 Angstroms, then subjected to an anisotropic RIE procedure, using $CF_4$ as an etchant for either silicon nitride or silicon oxynitride, and using $CHF_3$ if silicon oxide is used.

21. The method of claim 16, wherein said first IPO layer is a silicon oxide layer, or a borophosphosilicate glass, (BPSG), layer, obtained via PECVD procedures, at a thickness between about 4000 to 8000 Angstroms.

22. The method of claim 16, wherein said self-aligned contact openings are formed in said first IPO layer via a selective, anisotropic RIE procedure, using $CHF_3$ as an etchant for said first IPO layer, and with an etch rate ratio, or selectivity, of silicon oxide to silicon nitride, in $CHF_3$ of about 10 to 1.

23. The method of claim 16, wherein said metal silicide layer is either a titanium silicide, or a cobalt silicide layer, at a thickness between about 300 to 1000 Angstroms, formed via R.F. deposition of a titanium, or cobalt layer, at a thickness between about 100 to 500 Angstroms, then followed by a RTA anneal, performed at a temperature between about 700 to 900° C., in a nitrogen ambient.

* * * * *